(12) United States Patent
Fertig et al.

(10) Patent No.: US 7,880,207 B2
(45) Date of Patent: Feb. 1, 2011

(54) PHOTO DETECTOR DEVICE

(75) Inventors: Matthias Fertig, Altdorf (DE); Thomas E. Morf, Gross (CH); Jonas R. Weiss, Zurich (CH); Thomas Pflueger, Leinfelden (DE); Nikolaj Moll, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 99 days.

(21) Appl. No.: 12/350,991

(22) Filed: Jan. 9, 2009

(65) Prior Publication Data
US 2009/0179225 A1    Jul. 16, 2009

(30) Foreign Application Priority Data
Jan. 14, 2008    (EP) .................... 08100425

(51) Int. Cl.
*H01L 31/113* (2006.01)
(52) U.S. Cl. .............. 257/293; 438/66; 257/E31.115; 257/E31.121
(58) Field of Classification Search ............... 257/290, 257/291, 292, 431, 462, 293, E31.115, E31.121, 257/E33.076; 438/57, 66
See application file for complete search history.

(56) References Cited

U.S. PATENT DOCUMENTS

| 6,812,495 | B2 | 11/2004 | Wada et al. | |
| 7,164,182 | B2 | 1/2007 | Mouli | |
| 7,358,585 | B2 * | 4/2008 | Patel et al. | 257/454 |
| 7,608,903 | B2 * | 10/2009 | Mouli | 257/431 |
| 2005/0006565 | A1 | 1/2005 | Mouli | |

* cited by examiner

*Primary Examiner*—Quoc D Hoang
(74) *Attorney, Agent, or Firm*—Anthony J. Canale

(57) ABSTRACT

A photo detector device comprising a first layer comprising a first material, and a second layer arranged adjacent to the first layer, the second layer comprising strained silicon, wherein the second layer further comprises a light absorption region located substantially within the strained silicon, wherein the first or the second layer is arranged on a substrate.

27 Claims, 2 Drawing Sheets

PHOTO DETECTOR DEVICE

BACKGROUND

The invention relates to a photo detector device and an integrated circuit ("IC") comprising one or more photo detector devices according to the invention.

Photo detectors are devices that convert optical signals into electrical signals. Photo detector devices are for example employed to detect light for the purpose of optical communication.

Nowadays, optical technology is focusing on photonic integrated circuits on a chip. Indium-gallium-arsenide ("InGaAs") photo detectors are not easy to implement on a silicon chip, since lattice constants are different and InGaAs is a III-V compound semi-conductor. In general, the elements Indium, Gallium and Arsenide are all dopants in silicon to show donor or acceptor characteristics and could thus alter the silicon circuit performance if diffused.

Optical Input/Outputs ("IOs") or optical chip-to-chip communication directly onto the chip is restricted today by the fact that the realization of optical detectors in Complementary Metal-Oxide Semiconductor ("CMOS") integrated circuits is very challenging. Several approaches are found in the literature to integrate optical detectors into a commercial IC process. They range from on chip photo diodes ("PD") implemented with PN junction available in the process over deep trench memory cells used as detector to hybrid implementations where additional semiconductor layers e.g. Germanium, may be placed on top of the chip.

Silicon is a usable semiconductor only for very short wavelength detectors. A CMOS process or even better a Bipolar Complementary Metal-Oxide Semiconductor ("BICMOS") process offers a whole range of PN-junctions which may be used as detectors. However, in a state of the art process the doping levels are very high. As a result, the depletion width of such PN-junctions is very narrow, approximately 50 nm to 100 nm. This leads to very high junction capacitances, which severely limits the frequency response of such a detector, and it will result in a very small responsivity due to the small volume which may be used to absorb photons. The photocurrent that is generated by incident light is limited by the charge mobility and thus limits the switching frequency of an optical detector. The faster the generated electrons are, the faster the optical detector becomes.

Using deep trenches as optical detectors has the benefit that depletion width and absorption length are decoupled. The depletion width forms horizontally on the sidewalls of the trenches and, since the light is usually applied normal to the chip surface, the absorption is perpendicular to the wafer surface. Deep trenches are in the order of 10 um deep, which is very much compatible with the absorption length in silicon (15 um) from light with a wavelength of 850 nm. However, these deep trenches were originally designed to form capacitors for embedded DRAM. As a result they show a very large amount of capacitance for a practical detector area. Using low doped silicon wafers and additional trenches to contact the low doped substrate, a high performance detector may be built. However, this requires a process modification, which will increase cost and decrease yield. Depending on the process this modification will also change the FET characteristics, which is highly undesirable.

Implementing an optical detector using a silicon on insulator ("SOI") process is even more challenging. In such a process the bulk silicon only serves as a mechanical substrate and has no electrical function. The active silicon layer is only approximately 70 nm thick and the corresponding resistance is quite high. Generally, strained silicon techniques like "dual stress liner" or "embedded silicon germanium" are used to improve the switching characteristic of P-MOS and N-MOS transistors by introducing tensile or compressive stress on the atomic structure. Under certain circumstances, this principle may also be used to enhance the performance of optical detectors.

Another approach which would work for bulk and SOI processes, is to add additional semiconductor layers onto the already very complicated CMOS layer stack to form a detector. Using this approach, high performance detectors have been shown to be feasible. However, this approach is very undesirable for reasons of cost and yield. Strained Silicon is available for standard SOI processes and hence no process modification is required.

SUMMARY

According to an embodiment of the invention, there is provided a photo detector device. In accordance with an embodiment of the invention, the photo detector device comprises a first layer comprising a first material, and a second layer arranged adjacent to the first layer. The second layer comprises strained silicon. The second layer further comprises a light absorption region located substantially within the strained silicon. The first or the second layer is arranged on a substrate The term SOI is an acronym for "silicon on insulator" and refers to the use of a layered silicon-insulator-silicon substrate in place of conventional silicon substrates in semiconductor manufacturing. The insulator is typically silicon-dioxide or less commonly sapphire (SOS, silicon on sapphire). The arrangement of a silicon-dioxide layer situated on a silicon substrate adjacent to the second layer comprising silicon is thus a tribute to the SOI technology. The silicon substrate serves in this case only as a mechanical substrate and has no electrical function.

The implementation of standard technology allows the usage of a strained silicon detector within a continued miniaturization of the surrounding microelectronic devices. The photo detector device is thus particularly advantageous as it is based on and fully compatible with SOI technology and may therefore be combined directly with electronic circuits on the same chip. Any structures may scale with the same factor as the implementing technology.

Strained silicon has electronic properties which are superior to those of bulk silicon. In particular, the strained silicon layer provides greater mobility for electrons and holes. Thus, the photo detector device according to the invention provides high charge mobility and thus a higher response and performance in comparison to a photo detector device which uses bulk silicon for light absorption. The high charge mobility also translates into greater photo current and higher responsivity of the photo detector device. This is particularly important as the trend in integrated circuit design goes towards integrated functionality and optical communication on the chip, using the extremely high parallelism and bandwidth of optics, wherein the strained photo detector device according to the invention provides enhanced performance.

Bulk silicon may be employed for light absorption in the visible range and in the near-infrared up to the indirect band edge of 1.15 micrometers. The tensile strain on the silicon has an effect on the band gap. With regard to bulk silicon, the band gap is reduced. Thus, light at still longer wavelengths may be absorbed by the strained silicon layer as may be absorbed by bulk silicon.

In accordance with an embodiment of the invention, the first material of the first layer causes tensile strain on the strained silicon of the second layer.

In accordance with an embodiment of the invention, the substrate is a silicon substrate or an electrically insulating substrate such as a silicon dioxide substrate.

In accordance with an embodiment of the invention, the first material comprises silicon-nitride or silicon-germanium. It has been found that these materials are particularly applicable as first layers and that these materials will cause tensile strain on a silicon layer that is arranged adjacent to this material.

In accordance with an embodiment of the invention, the second layer comprises a set of strips. Each strip of the set of strips protrudes the second layer. In accordance with a further embodiment of the invention, the protruding strips extend into the first layer. In particular, the strips relate to the regions in the second layer wherein light is absorbed by the strained silicon as will be further outlined below.

In accordance with an embodiment of the invention, a strip of the set of strips separates a first region of the second layer from a second region of the second layer. The first region is p-doped and the second region is n-doped, or with an inverted polarity of the photo detector device, the first region is n-doped and the second region is p-doped.

In accordance with an embodiment of the invention, the strip comprises a doped region and a poly-silicon region. The doped region of the strip is bordered by the first and second regions of the second layer. The poly-silicon region is spatially located within the part of the strip which protrudes the second layer, wherein the doped region is p- or n-doped, depending on the device polarity. Further, the doped region and the poly-silicon region are separated by a silicon-oxide region.

Besides the usage of the poly-silicon region, any other material may be used which has a significantly different refractive index compared to the material used for the first layer and the second layer.

The strip may, for example, be formed in the second layer by means of semiconductor process capabilities. This means, that from a manufacturing point of view the doped region of the strip and the poly-silicon region may also be regarded as 'layers'.

In accordance with an embodiment of the invention, the doped region is basically vertically arranged with respect to the second layer.

In accordance with an embodiment of the invention, the first region is doped with a first concentration of p-donors and the doped region of the strip is doped with a second concentration of p-donors. The second concentration of the p-donors is at least an order of magnitude smaller than the first concentration of p-donors. Alternatively for a device with inverted polarity, the first region is doped with a first concentration of n-donors and the doped region of the strip is doped with a second concentration of n-donors. Thereby, the second concentration of the n-donors is at least an order of magnitude smaller than the first concentration of n-donors.

In accordance with an embodiment of the invention, the photo detector further comprises a light absorption region, wherein the light absorption region is spatially located within the second layer, wherein the light absorption region is located where the doped region of the strip borders the first and second regions. The light absorption region relates to a depletion region that extends between highly doped regions. The depletion is caused by the different concentration of dopants in the layers adjacent to the light absorption region. Electron-hole pairs created in the light absorption region due to the absorption of light causes an electric current that may be conducted away by an appropriate wiring, having minimal overlap with the strained depleted regions described above.

In accordance with an embodiment of the invention, the second region of the second layer is doped with a third concentration of donors, wherein the magnitudes of the first and third concentrations are approximately equal.

In accordance with an embodiment of the invention, the first layer is bordered by at least one insulating layer. The at least one insulating layer comprise a material with a high transmittance for the light to be absorbed in the second layer. Thus, the photo detector device is adapted to detect light that has passed through the at least one insulating layer.

In accordance with an embodiment of the invention, the device further comprises at least one insulating layer, wherein the first or the second layer is bordered by the at least one insulating layer, wherein the at least one insulating layer comprises a material with a high transmittance for light to be absorbed in the second layer. The second layer is bordered by a layer of silicon-dioxide. The silicon-dioxide layer is bordered by a substrate, wherein the substrate comprises silicon.

In accordance with an embodiment of the invention, the first region of the second layer and the second region of the second layer and the poly-silicon region comprise electrical contacts. To the first region of the second layer and to the second region of the second layer a block voltage is preferably applied. This leads to an increase of the depletion zone accordingly, which of course depends on the doping of said regions. The block-voltage induced electrical field in the light-absorbing depletion layer is also used to separate the generated electron-hole pairs which finally leads to aforementioned detectable photo-current.

Applying the block voltage controls the depletion in horizontal direction which means in the direction between the first and the second regions. An additional voltage applied to the poly-silicon region further controls the depletion basically in vertical direction which means basically perpendicularly to the direction between the first and the second regions. The goal is an almost complete depletion of the depletion zone which then corresponds to a maximized active light absorption zone.

According to a further aspect of the invention, there is provided an integrated circuit comprising one or more photo detector devices in accordance with the invention.

In accordance with an embodiment of the invention, the integrated circuit may be based on CMOS or BICMOS technology.

DETAILED DESCRIPTION

Figure 1:
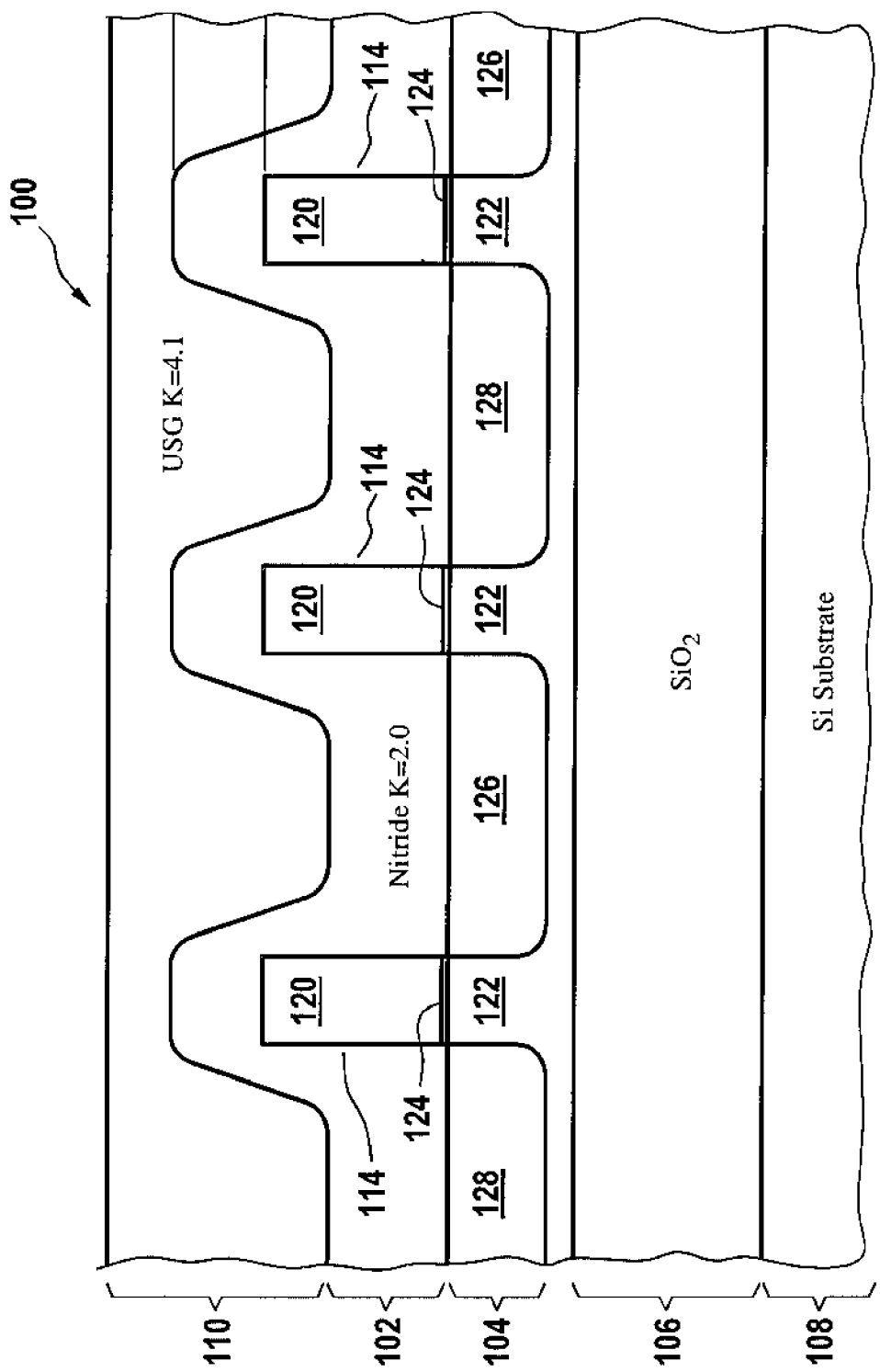
FIG. 1 shows schematically a cross-sectional view of a photo detector device in accordance with the invention.

FIG. 1 shows schematically a cross-sectional view of a photo detector device 100. The photo detector device 100 comprises a first layer 102 which comprises a dielectric layer such as, for example, silicon-nitride. The photo detector device 100 further comprises a second layer 104 which comprises a strained semiconductor layer such as, for example, strained silicon. The second layer 104 is thus arranged adjacent to the first layer 102 such that the strain caused by the material of the first layer results in the formation of strained silicon. The photo detector device 100 further comprises a third layer 106 which comprises a dielectric layer such as, for example, silicon-dioxide and that resides on a silicon substrate 108.

The photo detector device 100 may also comprise a fourth layer 110, wherein the fourth layer 110 is located on top of the first layer 102.

The fourth layer 110 may be an insulating layer, which planarizes an upper surface and isolates electrically. The layer comprises a material which has a low absorption coefficient for the light that is to be absorbed in the second layer 104. Thus, the fourth layer 110 may be regarded as a window of the photo detector device through which light to be detected may enter the photo detector device 100. Preferably, the layer is made of silicon-dioxide or something comparable. It has to be noted that the fourth layer 110 is only depicted in an exemplary manner. It is possible, that a multitude of additional layers are further located on top of the layer 110.

Layer 114 forms a set of strips 120. In an embodiment of the invention, the set of strips 120 are poly-silicon strips. However, the set may also be formed out of an other material with different refractive index compared to layer 114. According to the embodiment shown in FIG. 1, the strips 114 may be regarded as plain slabs that extend into the first layer 102.

The strips of the set of strips 120 may or may not be equally spaced. Important is that the set of strips 120 define a maximum reasonable amount of p-n depletion zones. A reasonable amount of depletion zones considers the width of the depletion zones with respect to the rest of the device. Thus, a photo detector device 100 is obtained for which the ratio between the width of each strip and the distance between neighboring strips is such that a maximum number of tensile areas are formed. This allows for an efficient detection of light in an extended range of wavelength of incident light with an increased charge mobility, responsivity and photo current. It is however evident to the skilled person that currently employed fabrication technologies for such devices, for example lithography, limits the minimum feature sizes of the entire structure. Especially the formation of the poly-silicon strips is subject of this limitation.

Several regions may be identified within the second layer 104 and within the strips. The region of the strip which protrudes into the first layer is referred to as poly-silicon region 120 as the silicon of this region corresponds to poly-silicon. Furthermore, each strip introduces a doped region 122 by means of process capabilities and design dimensions of the aligned poly-silicon strips. Thereby, the doped region is the region of the strip spatially located basically within the second layer. The doping of the regions 122 may be either a p- or n-doping.

Between the poly-silicon region 120 and the doped region 122 a thin isolating dielectric layer 124 such as, for example, a silicon oxide layer, is located. This layer 124 prevents a charging of the poly-silicon region 120 and also supports a depletion of the region within the doped regions 122 within the second layer 104. Light will be absorbed in the depletion region which forms within the doped regions 122 within the second layer 104.

Each strip 114 of the set of strips separates a first region of the second layer from a second region of the second layer. For example, the strip 114 separates a first region 126 of the second layer 104 from a second region 128 of the second layer 104. Regarding the device 100, as depicted in FIG. 1, the spatial sequence first region 126—strip 114—second region 128—strip 114—first region 126 etc. is continuously repeated.

The first regions 126 are heavily p-doped and the second regions 128 are heavily n-doped. The p-doped region 122 is moderately p-doped. This has the effect that a depletion layer is formed in the so called light absorption region which extends over the entire region 122 and which allows for the absorption of light and formation of electron-hole pairs which cause an electric current that may be detected by appropriately wiring up the first regions 126 and second regions 128 of the second layer 104 as well as the p-doped region 122 of a strip.

In an alternative embodiment not shown here, instead of using the first layer 102 comprising silicon-nitride on top of the second layer 104, the first layer 102 may also be spatially located in between the second layer 104 and the SiO2 layer 106. In this case, the first layer 102 comprises silicon germanium (SiGe). However, any other kind of material may be used which yields the effect of maximizing the strain in the second layer 104.

Figure 2:
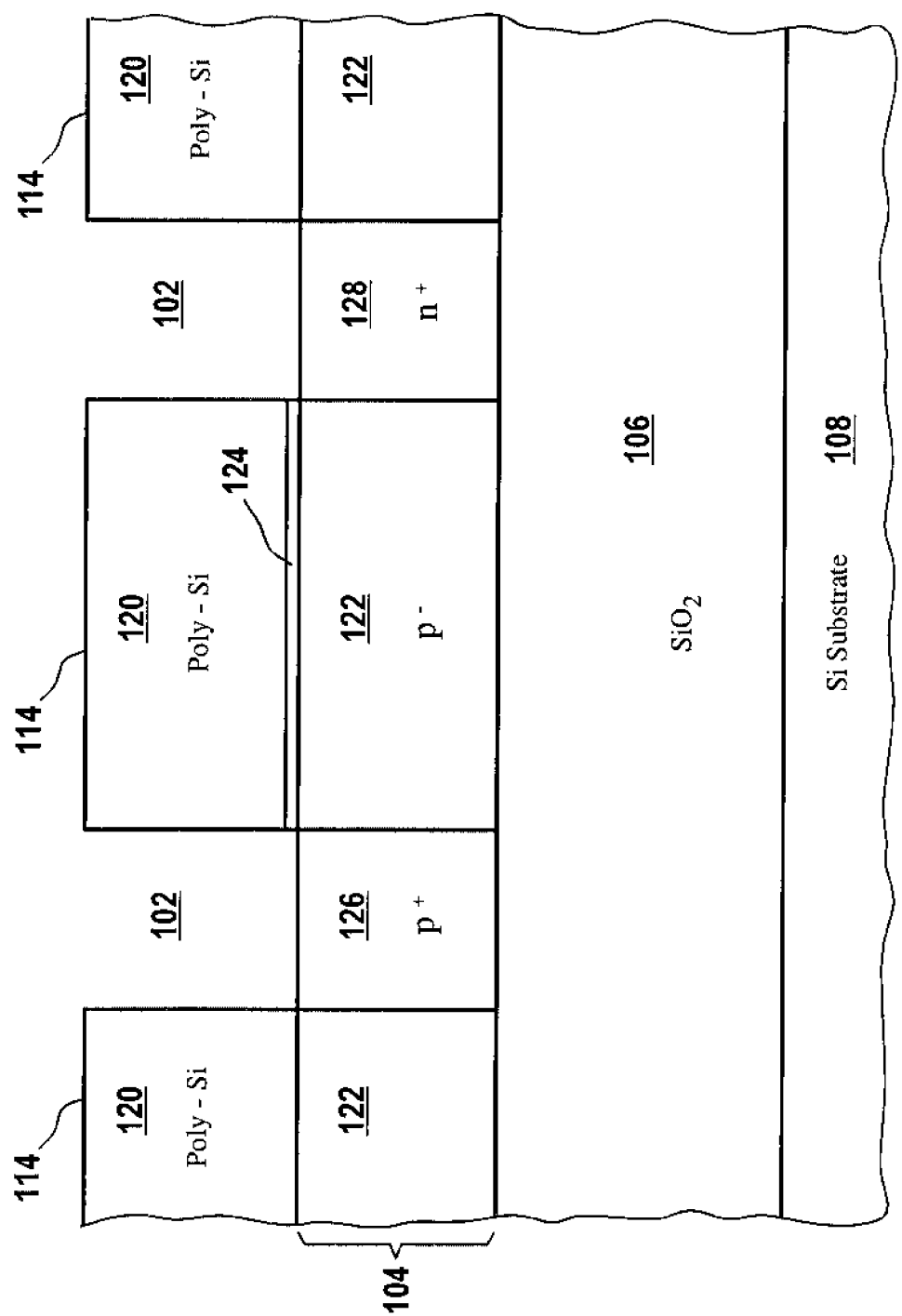
FIG. 2 shows schematically a cross-sectional view of a portion of a photo detector device in accordance with the invention.

FIG. 2 shows a cross-sectional view of a portion of the photo detector device 100 in more detail. The reference numerals used in FIG. 1 have been used to refer to the corresponding elements in FIG. 2. As has been pointed out with reference to FIG. 1, the light absorption region extends over the entire region 122 between the p-doped regions 126 and n-doped region 128 due to the arrangement of the p-doped first region 126 and the n-doped second region 128 adjacent to the p-doped region 122 of the strip 114. The first region 126 is heavily p-doped as indicated in FIG. 2 by use of the + next to the p. Similarly, the second region is heavily n-doped as indicated in FIG. 2 by use of the + subsequent to the n. The concentration of p-dopants or n-dopants in the first and second region, respectively, is about $1\times10^{21}$ cm-3, whereas the p-doped region 122 is moderately doped with a concentration of p-dopants of about $1\times10^{17}$ cm-3.

It is noted that other than depicted in FIGS. 1 and 2, a device with inverted polarity may also be designed by using n-type donors in the region 122 of the strip and n-doped and p doped first and second regions 126 and 128. However, this requires adapting the tensile strain accordingly to the new doping parameters.

Not shown here is an electrical contacting of the first region 126 of the second layer and the second region 128 of the second layer and the Poly-silicon region 120. To the first region 126 of the second layer and to the second region 128 of the second layer a block voltage is applied which controls the depletion of the p-doped region 122 in a horizontal direction. An additional voltage may be applied to the poly-silicon 120 region which controls the depletion basically in a vertical direction.

The block-voltage induced electrical field in the light-absorbing depletion layer 122 is also used to separate the generated electron-hole pairs which finally leads to aforementioned detectable photo-current.

An electrical contacting of the first region 126, the second region 128 and the poly-silicon region 120 may be performed basically perpendicularly from 'top' through the layers 110 and 102.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

The invention claimed is:

1. A photo detector device comprising:
a first layer comprising a first material;
a second layer arranged adjacent to the first layer, the second layer comprising strained silicon;
wherein the second layer further comprises a set of strips formed upon a surface of the second layer, each strip of the set of strips comprises a light absorption region located substantially within the strained silicon, and further wherein a dielectric layer is located between each strip of the set of strips and the corresponding light absorption region; and
wherein the first or the second layer is arranged on a substrate.

2. A photo detector device according to claim 1, wherein: the first material of the first layer causes tensile strain on the strained silicon of the second layer.

3. A photo detector device according to claim 1, wherein: the substrate comprises a silicon substrate.

4. A photo detector device according to claim 1, wherein: the substrate comprises an electrically insulating substrate.

5. The photo detector device according to claim 1, wherein: the first material comprises a lattice constant capable of generating tensile strain in the second layer and different from the lattice constant of the second layer.

6. The photo detector device according to claim 1, wherein: the first material comprises silicon-nitride.

7. The photo detector device according to claim 1, wherein: the first material comprises silicon-germanium.

8. The photo detector device according to claim 1, wherein: each strip of the set of strips protrudes the second layer.

9. The photo detector device according to claim 8, wherein: the protruding strips extend into the first layer.

10. The photo detector device according to claim 8, wherein:
each strip of the set of strips separates a first region of the second layer from a second region of the second layer.

11. The photo detector device according to claim 10, wherein:
the first region is p-doped and the second region is n-doped.

12. The photo detector device according to claim 11, wherein the light absorption region is located between the first and second region.

13. The photo detector device according to claim 10, wherein:
the first region is n-doped and the second region is p-doped.

14. The photo detector device according to claim 10, wherein:
each strip of the set of strips comprises the light absorption region and a poly-silicon region;
wherein the light absorption region and the poly-silicon region are separated by a silicon-oxide region;
wherein the light absorption region is bordered by the first and second regions of the second layer;
wherein the light absorption region is p- or n-doped; and
wherein the poly-silicon region is spatially located within the part of the strip which protrudes the second layer.

15. The photo detector device according to claim 14, wherein:
the first region is doped with a first concentration of p-donors;
the light absorption region is doped with a second concentration of p-donors; and
wherein the second concentration of p-donors is at least an order of magnitude smaller than the first concentration of p-donors.

16. The photo detector device according to claim 15, wherein:
the second region of the second layer is doped with a third concentration of donors;
wherein the polarity of said donors is opposite from polarity of the donors of the first region; and
wherein the magnitudes of the first and third concentrations are approximately equal.

17. The photo detector device according to claim 14, wherein:
the first region is doped with a first concentration of n-donors;
the light absorption region is doped with a second concentration of n-donors; and
wherein the second concentration of n-donors is at least an order of magnitude smaller than the first concentration of n-donors.

18. The photo detector device according to claim 17, wherein:
the second region of the second layer is doped with a third concentration of donors;
wherein the polarity of said donors is opposite from polarity of the donors of the first region; and
wherein the magnitudes of the first and third concentrations are approximately equal.

19. The photo detector device according to claim 14, wherein:
the first region of the second layer and the second region of the second layer and the poly-silicon region comprise electrical contacts.

20. The photo detector device according to claim 1:
further comprising at least one insulating layer;
wherein the first or the second layer is bordered by said insulating layer; and
wherein said insulating layer comprises a material with a high transmittance for light to be absorbed in the second layer.

21. An integrated circuit comprising:
one or more photo detector devices comprising:
a first layer comprising a first material;
a second layer arranged adjacent to the first layer, the second layer comprising strained silicon;
wherein the second layer further comprises a set of strips formed upon a surface of the second layer, each strip of the set of strips comprises a light absorption region located substantially within the strained silicon, and further wherein a dielectric layer is located between each strip of the set of strips and the corresponding light absorption region; and
wherein the first or the second layer is arranged on a substrate.

22. An integrated circuit according to claim 21, wherein: the first material of the first layer causes tensile strain on the strained silicon of the second layer.

23. An integrated circuit according to claim 21, wherein: the substrate comprises a silicon substrate.

24. An integrated circuit according to claim 21, wherein: the substrate comprises an electrically insulating substrate.

25. The integrated circuit according to claim 21, wherein: the circuit is based on CMOS or BICMOS technology.

26. A method of forming a photo detector device comprising:
   forming a first layer comprising a first material;
   forming a second layer arranged adjacent to the first layer, the second layer comprising strained silicon;
   forming a set of strips upon a surface of the second layer, each strip of the set of strips comprises a light absorption region located substantially within the strained silicon;
   forming a dielectric layer between each strip of the set of strips and the corresponding light absorption region; and
   arranging the first or the second layer on a substrate.

27. The method of claim 26, wherein the first material of the first layer imparts a tensile strain on the strained silicon of the second layer.

* * * * *